United States Patent [19]

Tarver et al.

[11] Patent Number: 4,918,572
[45] Date of Patent: Apr. 17, 1990

[54] MODULAR ELECTRONIC PACKAGE

[75] Inventors: Carl R. Tarver, Phoenix; James G. Lawrence, Buckeye, both of Ariz.; Charles L. Whittington, Lake Zurich, Ill.

[73] Assignees: Motorola Computer X, Inc., Schaumburg, Ill.; Emtek Health Care Systems, Inc., Tempe, Ariz.

[21] Appl. No.: 289,885

[22] Filed: Dec. 27, 1988

[51] Int. Cl.$^4$ .............................................. H05K 7/10
[52] U.S. Cl. .................................................. 361/395
[58] Field of Search ............... 361/392, 393, 394, 395, 361/390, 391, 415

[56] References Cited

U.S. PATENT DOCUMENTS 4,602,164  7/1986  Gore et al. ..................... 361/393

FOREIGN PATENT DOCUMENTS 3335110  4/1985  Fed. Rep. of Germany ...... 361/394

Primary Examiner—Roy N. Envall, Jr.
Attorney, Agent, or Firm—Walter Nielsen

[57] ABSTRACT

Method and apparatus for packaging electronic equipment comprise a housing and a "midplane" that is removably secured to suitable flanges centrally located within the housing. Individual sub-modules (CPU, disk drive, I/O unit, power supply, etc.) have suitable electrical connectors which mate with corresponding connectors on the midplane. The sub-modules are inserted into the midplane from different sides of the housing. The exposed, outer surfaces of the sub-modules may either be finished in final form, or suitable bezels may be placed over the sides of the housing so that the sub-modules can be appropriately accessed for necessary replacement or repair.

4 Claims, 3 Drawing Sheets

MODULAR ELECTRONIC PACKAGE

TECHNICAL FIELD

This invention relates generally to the packaging of electronic equipment, and, in particular, to method and apparatus utilizing a midplane into which electronic sub-modules or circuit boards are coupled from each side.

BACKGROUND OF THE INVENTION

The present invention concerns a method for quickly assembling an electronic module, such as a mini-computer or personal computer without employing any wire-harnessing or cabling in the final assembly stage. A plurality of sub-modules, such as a central processing unit (CPU), disk drive, input/output unit, power supply, fan, etc., can be quickly and accurately packaged within a chassis housing. The assembled apparatus has utility, however, in assembling a wide range of electronic equipment.

It is well known in the electronic packaging art to provide an electrical backplane into which one or more sub-modules or circuit boards are inserted.

One problem associated with the known prior art is that circuit boards are generally coupled to the backplane through edge connectors, thus requiring considerable force and care when inserting and removing the boards. Another problem with the known prior art is that the utilization of a backplane limits the number of sub-modules or circuit boards that may be coupled to the backplane, since such components ordinarily must be sufficiently spaced apart to provide for heat dissipation. In addition, the size of the sub-modules or boards often restricts the internal geometry of the overall assembly.

It is therefore desirable to provide an electronic module which can be easily and quickly assembled, without any final assembly wiring, and which permits a significantly greater number of sub-modules and circuit boards to be coupled together.

It would also be desirable to provide an electronic module, in which the sub-components, such as sub-modules and circuit boards, can easily and quickly be removed for servicing and replacement.

BRIEF SUMMARY OF INVENTION

Accordingly, it is an object of the present invention to provide an improved electronic package.

It is also an object of the present invention to provide an electronic packaging apparatus and method which facilities assembly and disassembly.

These and other objects are achieved in accordance with a preferred embodiment of the invention by providing a method of assembling an electronic module, the method comprising the steps of (a) providing at least two electronic sub-modules, each of the electronic sub-modules performing a sub-function of the electronic module; (b) providing a circuit board, the circuit board comprising (i) a plurality of electrical conductors, (ii) first connector means coupled to the plurality of conductors and located on a first side of the circuit board, and (iii) second connector means coupled to the plurality of conductors and located on a second side of the circuit board; (c) coupling a first one of the electronic sub-modules to the first connector means; and (d) coupling a second one of the electronic sub-modules to the second connector means; whereby the electronic module can be assembled without utilizing wiring harnesses.

BRIEF DESCRIPTION OF THE DRAWINGS

The invention is pointed out with particularly in the appended claims. However, other features of the invention will become more apparent and the invention will be best understood by referring to the following detailed description in conjunction with the accompanying drawings in which:

DETAILED DESCRIPTION OF THE INVENTION

Figure 1:
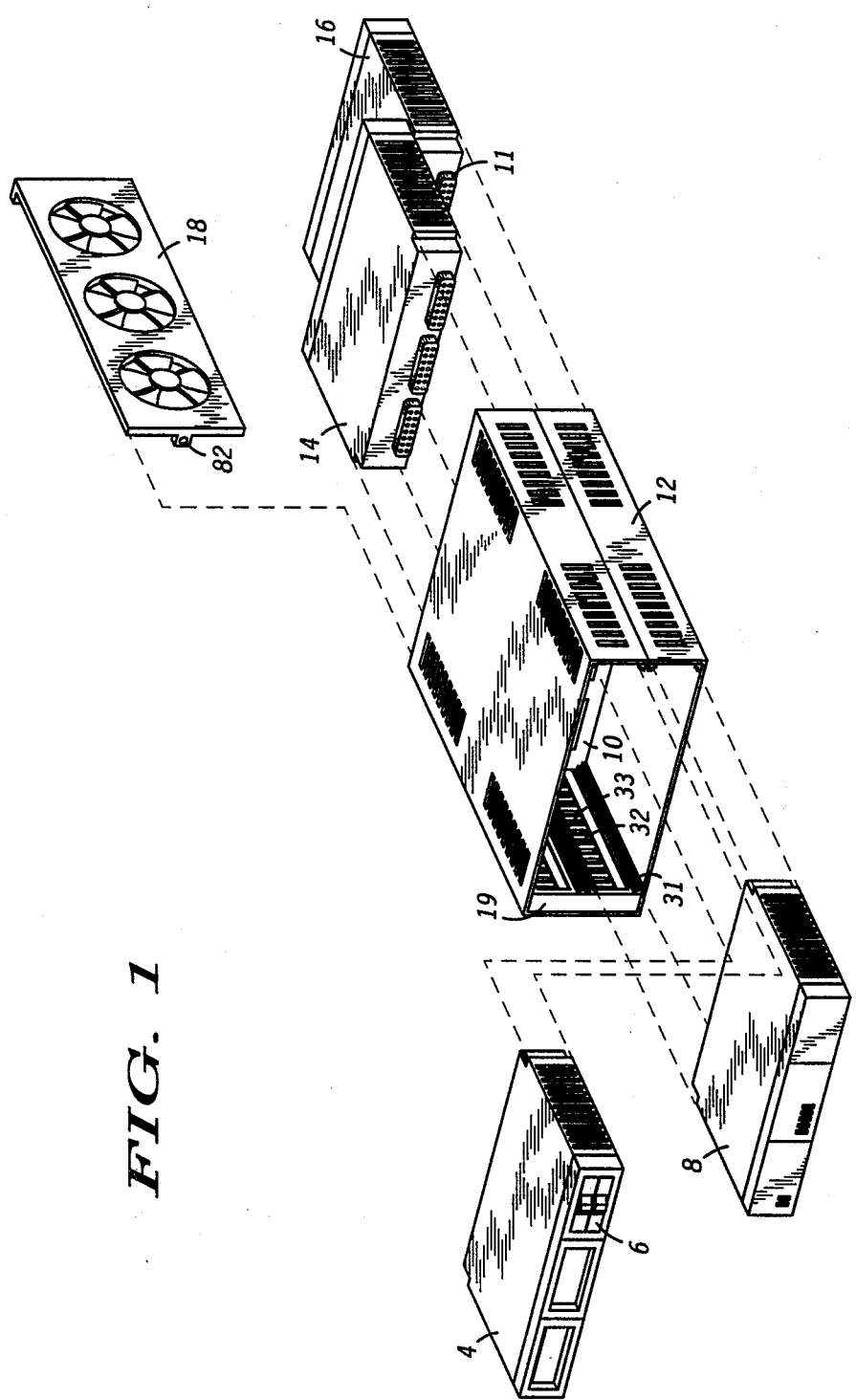
FIG. 1 shows an exploded, perspective view of a preferred embodiment of the modular electronic package of the present invention.

Referring now to FIG. 1, an exploded, perspective view of a preferred embodiment of the modular electronic package of the present invention is shown.

The electronic package comprises a rectangular, box-like housing member 12 and a plurality of sub-modules, such as disk drive sub-module 4, CPU sub-module 8, input/output sub-module 14, power supply sub-module 16, and fan sub-module 18.

Housing member comprises a midplane member 10, only the lower portion of which is visible through the open front side of housing member 12. In a preferred embodiment of the invention, midplane member 10 is a multi-layer printed circuit board having a plurality of appropriate electrical connectors on each side. The connectors may be standard 64-pin D-type connectors which are commercially available.

Each sub-module comprises one or more, as appropriate, mating D-type connectors located, for example, on its rear surface. A portion of a connector module 16.

As shown in this exploded view, CPU sub-module 8 is insertable into the open front side of housing 12 until it rear connectors (not visible in FIG. 1) contact and mate with the corresponding connectors on midplane 10, thereby electrically coupling CPU sub-module 8 to midplane 10. Likewise, disk drive sub-module 4 is insertable into the same side of housing member 12 until its connectors mate with corresponding connectors on midplane 10 (not visible in FIG. 1).

Input/output sub-module 14 and power supply sub-module 16 are insertable from the other side of housing member 12, until there respective connectors make electrical contact with the corresponding connectors on the opposite side of midplane 10. Fan sub-module 18 is insertable into fan housing member 19 where its power supply connector 82 makes electrical contact with a corresponding connector.

In this manner, a complete mini-computer can be reliably assembled in a very short time.

Figure 2:
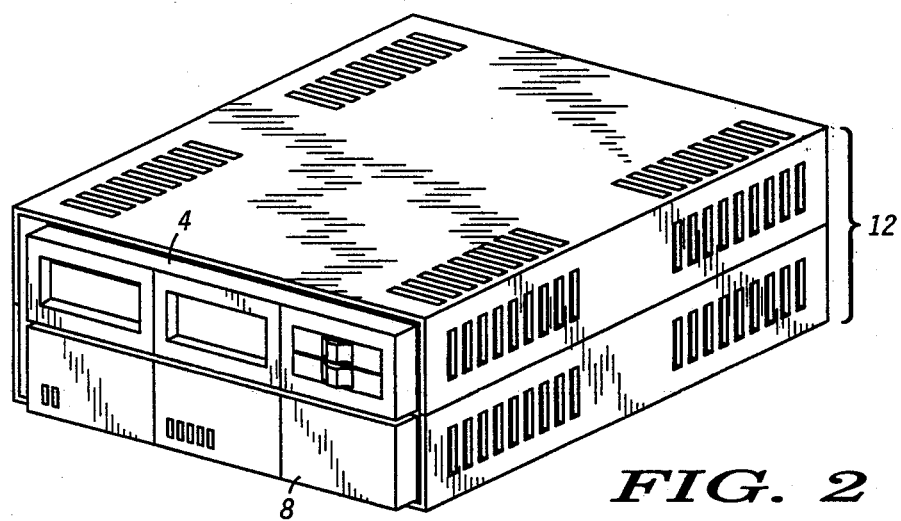
FIG. 2 shows a perspective view of an assembled modular electronic package of the present invention.

FIG. 2 shows a perspective view of an assembled modular electronic package of the present invention.

The user-accessible surfaces of the disk drive sub-module 4 and the CPU sub-module 8 are visible.

Figure 3:
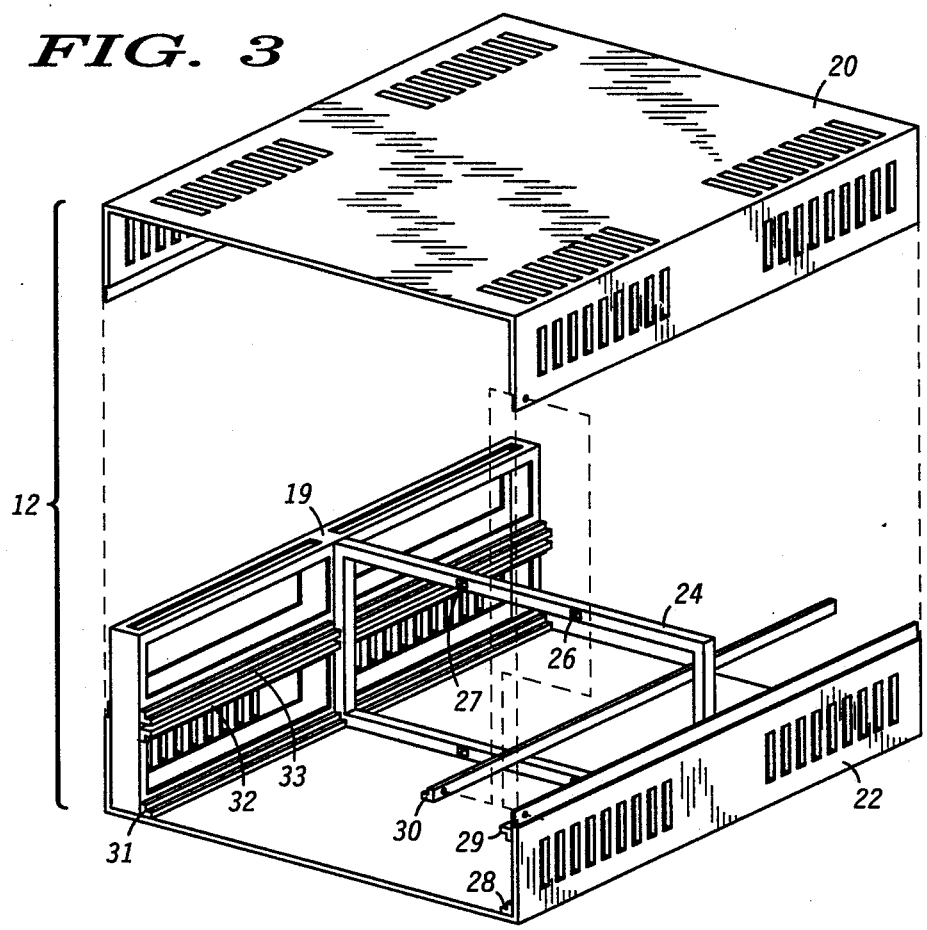
FIG. 3 shows a perspective, exploded view of certain components of the modular electronic package of the present invention, including the top and bottom housing members, midplane support member, fan housing member, and sub-module support guides.

FIG. 3 shows a perspective, exploded view of certain components of the modular electronic package of the present invention. These include the top housing member 20, bottom housing member 22, midplane support member 24, fan sub-module housing member 19, and submodule support guides 28-33. The top and bottom housing members may be suitably secured together by appropriate means, such as screws, bolts, rivets, welding, etc.

The midplane support member 24 is a frame-like member which is open in the central portion. In a preferred embodiment of the invention, midplane support member 24 is securably located mid-way between the open sides of housing member 12 and co-planar with the open sides thereof. To facilitate alignment of the midplane 10 (FIG. 4) with respect to the midplane support member 24, the latter component is provided with one or more registration members, such as apertures 26 and 27. Registration apertures 26 and 27 mate with registration members 86 and 88 (FIG. 4) on the rear side of midplane member 10. By properly positioning the midplane member 10 within the housing member 12, insertion and removal of the sub-modules or boards is facilitated, since the connectors on the sub-modules or boards will be aligned with their corresponding connectors on the midplane member.

Also shown in FIG. 3 are sub-module support guides 28-33. Sub-module support guide 28 (just visible in FIG. 3) is secured to the lower portion of lower housing member 22. Sub-module support guide 29 is secured to the upper edge of lower housing member 22, and sub-module support guide 30 is secured to the lower edge of upper housing member 20.

Sub-module support guides 32 and 33 are secured to the central portion of the inward-facing surface of fan sub-module housing 19, and support guide 31 is secured to the lower portion thereof. Support guides 31-33 are shown in slightly greater detail in FIG. 5.

Support guides 30 and 33 are L-shaped members which run substantially the entire length of the housing member 12 and serve to support the lower surfaces of upper sub-modules 4 and 14. Support guides 29 and 32 limit upward movement of the upper surfaces of lower sub-modules 8 and 16. Support guides 28 and 31 support the lower surfaces of lower sub-modules 8 and 16.

The sub-module support guides assist in securing the sub-modules within the housing member 12 and in insertion and removal of the sub-modules from the housing member 22, but they are not essential elements of the invention.

The fan sub-module 18 may be mounted within the housing member 12 by means of a fan housing member 19 (shown in greater detail in FIG. 5) located along one side of housing member 12.

Figure 4:
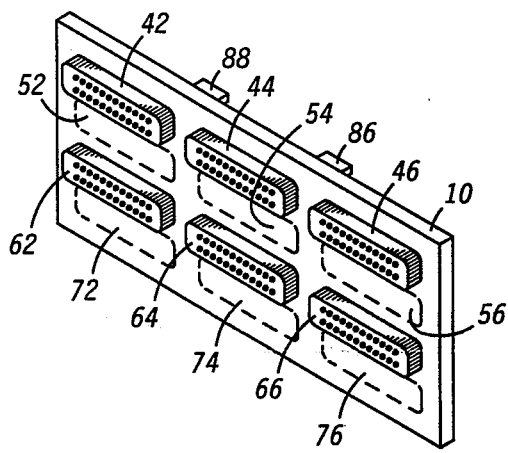
FIG. 4 shows the midplane component of the modular electronic package of the present invention.

FIG. 4 shows the midplane component 10 of the modular electronic package of the present invention. Midplane 10, in a preferred embodiment of the invention, is a multi-layer epoxy-composition printed circuit board. The circuit board may contain electrically active components, such as capacitors, resistors, and integrated circuits suitably mounted, or it may comprise only electrical conductors.

As shown in FIG. 4, midplane member 10 comprises a first row of D-type electrical connectors 42, 44, and 46 facing toward the reader. A second row of connectors 52, 54, and 56 faces out from the rear surface of midplane member 10, and the second row is off-set with respect to the first row. A third row of connectors 62, 64, and 66 faces the reader, and fourth row of connectors 72, 74, and 76 faces away from the rear surface of midplane member 10. In the embodiment shown, the D-type connectors on the midplane member 10 are female type, and those located at the rear of the sub-modules are male type.

The first row of connectors 42, 44, and 46 mate with corresponding connectors at the rear of the disk drive sub-module 4. The second row (52, 54, and 56) mates with those at the rear of input/output sub-module 14. The third row (62, 64, and 66) mates with those on the CPU sub-module 8, and the fourth row (72, 74, and 76) mates with those on the power supply sub-module 16.

Figure 5:
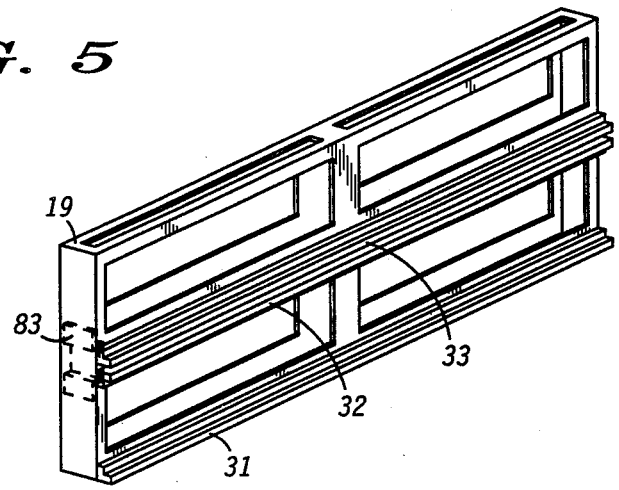
FIG. 5 shows a perspective view of a fan housing member and sub-module support guides affixed thereto.

FIG. 5 shows a perspective view of a fan housing member 19 and sub-module support guides 31-33 affixed thereto. Fan housing member 19 is a box-like member which is closed at the end nearer to the viewer and open at the opposite end to permit insertion of the fan sub-module 18. A connector mount 83 on the inside of the near end of fan housing member 19 supports a fan power connector (not shown) which engages a corresponding fan power connector 82 on fan sub-module 18 (FIG. 1) to provide electric power to the fan sub-module 18.

It will be apparent to those skilled in the art that the disclosed invention may be modified in numerous ways and may assume many embodiments other than the preferred form specifically set out and described above.

For example, the sub-modules and boards need not necessarily be inserted into the midplane in a direction which is normal to the midplane. A sub-module or board need not be coupled at a right angle to the midplane. Other types of connectors could be substituted for the D-type connectors illustrated. Different types of connectors can be mixed on the same midplane. Combinations of midplanes and backplanes could be used within one housing. Also, some sub-modules may be inserted in a vertical orientation, while others may be inserted in a horizontal orientation with respect to the housing member. Also, a combination of sub-modules and boards may be employed.

Also the fan sub-module and fan housing member could be designed such that the fan sub-module power connector could be insertable into a corresponding power connector on the midplane member rather than into a connector at the end of the fan housing member.

Also the exterior housing may be dispensed with, and one or more sub-modules or boards may be coupled to opposite sides of the midplane member. By suitably modifying the exterior housing of the sub-modules nearest the midplane, as for example by providing a skirt, the midplane may be concealed.

Accordingly, it is intended by the appended claims to cover all modifications of the invention which fall within the true spirit and scope of the invention.

What is claimed is:

1. A method of assembling an electronic module, said method comprising the following steps:
    (a) providing a box-like housing member having two substantially open opposing sides;
    (b) providing at least two electronic sub-modules, each of said electronic sub-modules performing a sub-function of said electronic mdoule and each comprising a first connector means;

(c) securing a circuit board within said housing member substantially coplanar with said sides, said circuit board comprising
  (i) a plurality of electrical conductors,
  (ii) second connector means coupled to said plurality of conductors and located on a first side of said circuit board, and
  (iii) third connector means coupled to said plurality of conductors and located on a second side of said circuit board;
(d) inserting a first one of said electronic submodules through one side of said housing member until its first connector means couples to said second connector means; and
(e) inserting a second one of said electronic submodules through another side of said housing member until its first connector means couples to said third connector means;
whereby said electronic module can be assembled without utilizing wiring harnesses.

2. The method of assembling an electronic module recited in claim 1, wherein said circuit board comprises a plurality of electronic components coupled to said electrical conductors.

3. An electronic module, said module comprising:
(a) a box-like housing member having two substantially open opposing sides;
(b) at least two electronic sub-modules, each of said electronic sub-modules performing a subfunction of said electronic module and each comprising a first connector means;
(c) a circuit board within said housing member, said circuit board being secured within said housing member substantially coplanar with said sides, said circuit board comprising
  (i) a plurality of electrical conductors,
  (ii) second connector means coupled to said plurality of conductors and located on a first side of said circuit board, and
  (iii) third connector means coupled to said plurality of conductors and located on a second side of said circuit board; whereby a first one of said electronic sub-modules may be inserted through one side of said housing member until its first connector means couples to said second connector means, and a second one of said electronic sub-modules may be inserted through another side of said housing member until its first connector means couples to said third connector means, and said electronic module is thereby assembled without utilizing wiring harnesses.

4. The electronic module recited in claim 3, wherein said circuit board comprises a plurality of electronic components coupled to said electrical conductors.

* * * * *